US006412471B1

(12) United States Patent
Trublowski et al.

(10) Patent No.: US 6,412,471 B1
(45) Date of Patent: Jul. 2, 2002

(54) THROTTLE BODY SYSTEM WITH INTEGRATED ELECTRONICS

(75) Inventors: John Trublowski, Troy; Timothy J. Yerdon, Plymouth; Jeff Klas, Ypsilanti, all of MI (US); Mitch DePerno, Cadiz (ES); Bertrand R. Mohr, Ann Arbor; Marc Bronzetti, Berkley, both of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/553,782

(22) Filed: Apr. 21, 2000

Related U.S. Application Data

(60) Provisional application No. 60/130,860, filed on Apr. 22, 1999.

(51) Int. Cl.[7] .................................................. F02D 9/02
(52) U.S. Cl. ................................... 123/399; 123/184.49
(58) Field of Search ................................. 123/337, 399, 123/478, 184.49, 184.61, 195 E

(56) References Cited

U.S. PATENT DOCUMENTS

| | | | | |
|---|---|---|---|---|
| 4,766,869 A | * | 8/1988 | de Concini et al. | 123/198 E |
| 4,986,242 A | * | 1/1991 | Bonfiglioli et al. | 123/479 |
| 5,094,212 A | * | 3/1992 | Kawaguchi et al. | 123/470 |
| 5,568,794 A | * | 10/1996 | Tabuchi et al. | 123/195 E |
| 5,988,119 A | | 11/1999 | Trublowski et al. | 123/41.31 |

* cited by examiner

Primary Examiner—Andrew M. Dolinar
Assistant Examiner—Arnold Castro
(74) Attorney, Agent, or Firm—Scott Confer; John Kajander; Larry Shelton

(57) ABSTRACT

A throttle body and an air control system that integrates the electronic engine control modules, sensors, actuators, and associated wiring on a throttle body is disclosed. In one version of the invention, there is provided a throttle body including a throttle body wall defining an airflow passage in the throttle body, a movable throttle plate that substantially conforms to the interior dimensions of the air flow passage, an engine control device (such as a sensor or an actuator) attached to the throttle body wall, and engine control electronics mounted to the throttle body wall in spaced apart relationship with the engine control device, the engine control electronics being electrically connected with the engine control device. In another version of the invention, there is provided an air control system including a throttle body having a wall defining a first airflow passage in the throttle body, a movable throttle plate substantially conforming to the interior dimensions of the first airflow passage, an air intake manifold having a wall defining a second airflow passage, the air intake manifold being attached to the throttle body such that the first airflow passage and the second airflow passage are placed in fluid communication, an engine control device mounted to the air intake manifold, and engine control electronics mounted to the throttle body wall, the engine control electronics being electrically connected with the engine control device.

8 Claims, 6 Drawing Sheets

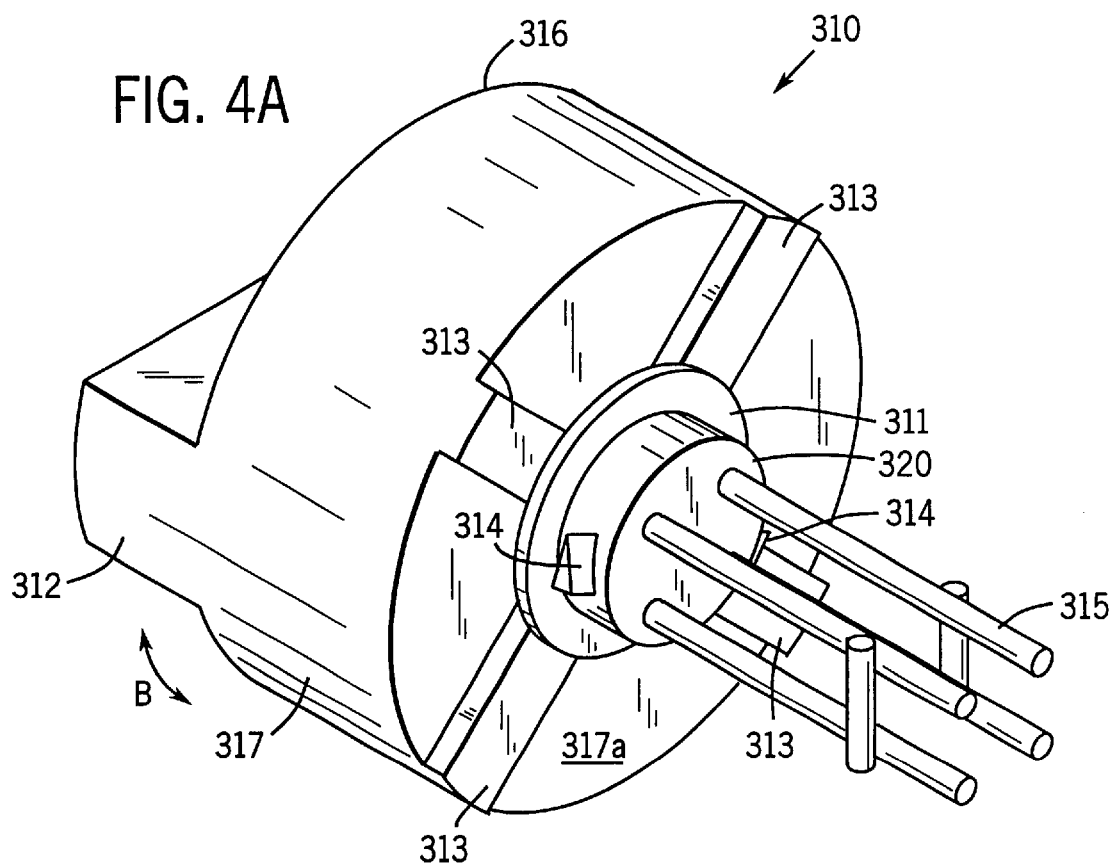

THROTTLE BODY SYSTEM WITH INTEGRATED ELECTRONICS

CROSS-REFERENCE TO RELATED APPLICATIONS

This application claims the benefit of U.S. Provisional Application No. 60/130,860 filed Apr. 22, 1999.

BACKGROUND OF THE INVENTION

1. Field of the Invention

This invention relates generally to an internal combustion engine having at least one electronic engine control module and an air control system including a throttle body, and more particularly to an air control system that integrates the electronic engine control modules, sensors, actuators, and associated wiring on a throttle body.

2. Description of the Related Art

A typical internal combustion engine includes a throttle body mounted to an air intake manifold. The throttle body includes at least one fluid passageway, and the air intake manifold also includes at least one fluid passageway. The throttle body may be sealably and removably fastened to the air intake manifold such that the fluid passageways are placed in sealed communication with each other.

When sealably fastened together, air may be inducted from the atmosphere through the throttle body fluid passageway, then into the air intake manifold fluid passageway, and then into the engine.

Most modern internal combustion engines, such as those found in current-model automobiles, also include one or more electronic control modules which process data from various sensors and provide control signals to various engine sub-system and components in order to maintain optimum engine performance. For example, the electronic engine control module may receive data from a throttle position sensor, a mass air flow sensor, and the like, and send control signals to the throttle plate actuator, idle speed bypass solenoid valve, and the like. The complex circuitry of the electronic engine control module may be temperature sensitive and thus may be mounted in a cooler portion of the engine compartment, typically against or within the firewall to provide the desired reliability of the electronics. A lengthy and complex wiring harness is necessary to communicate between the control unit and its associated sensors, control elements, and engine components.

Thus, it would be desirable, therefore, to find an approach which enhances the cooling of such electronic engine control modules, and which also eliminates the need for a lengthy wiring harness.

SUMMARY OF THE INVENTION

The present invention provides a throttle body and an air control system for use in an internal combustion engine. The invention permits proximate mounting of heat sensitive engine control electronics on or near the engine. By placing temperature sensitive components on or near the engine, wiring harnesses are simplified, reduced in length or eliminated completely.

In one version of the invention, there is provided a throttle body including a throttle body wall defining an airflow passage in the throttle body, a movable throttle plate that substantially conforms to the interior dimensions of the air flow passage, an engine control device (such as a sensor or an actuator) attached to the throttle body wall, and engine control electronics mounted to the throttle body wall in spaced apart relationship with the engine control device, the engine control electronics being electrically connected with the engine control device.

In another version of the invention, there is provided an air control system including a throttle body having a wall defining a first airflow passage in the throttle body, a movable throttle plate substantially conforming to the interior dimensions of the first airflow passage, an air intake manifold having a wall defining a second airflow passage, the air intake manifold being attached to the throttle body such that the first airflow passage and the second airflow passage are placed in fluid communication, an engine control device mounted to the air intake manifold, and engine control electronics mounted to the throttle body wall, the engine control electronics being electrically connected with the engine control device.

BRIEF DESCRIPTION OF THE DRAWINGS

The features, aspects, objects, and advantages of the present invention will become better understood upon consideration of the following detailed description, appended claims and accompanying drawings where:

FIG. 4A is a bottom perspective view of another sensor suitable for use with the present invention;

Figure 1:
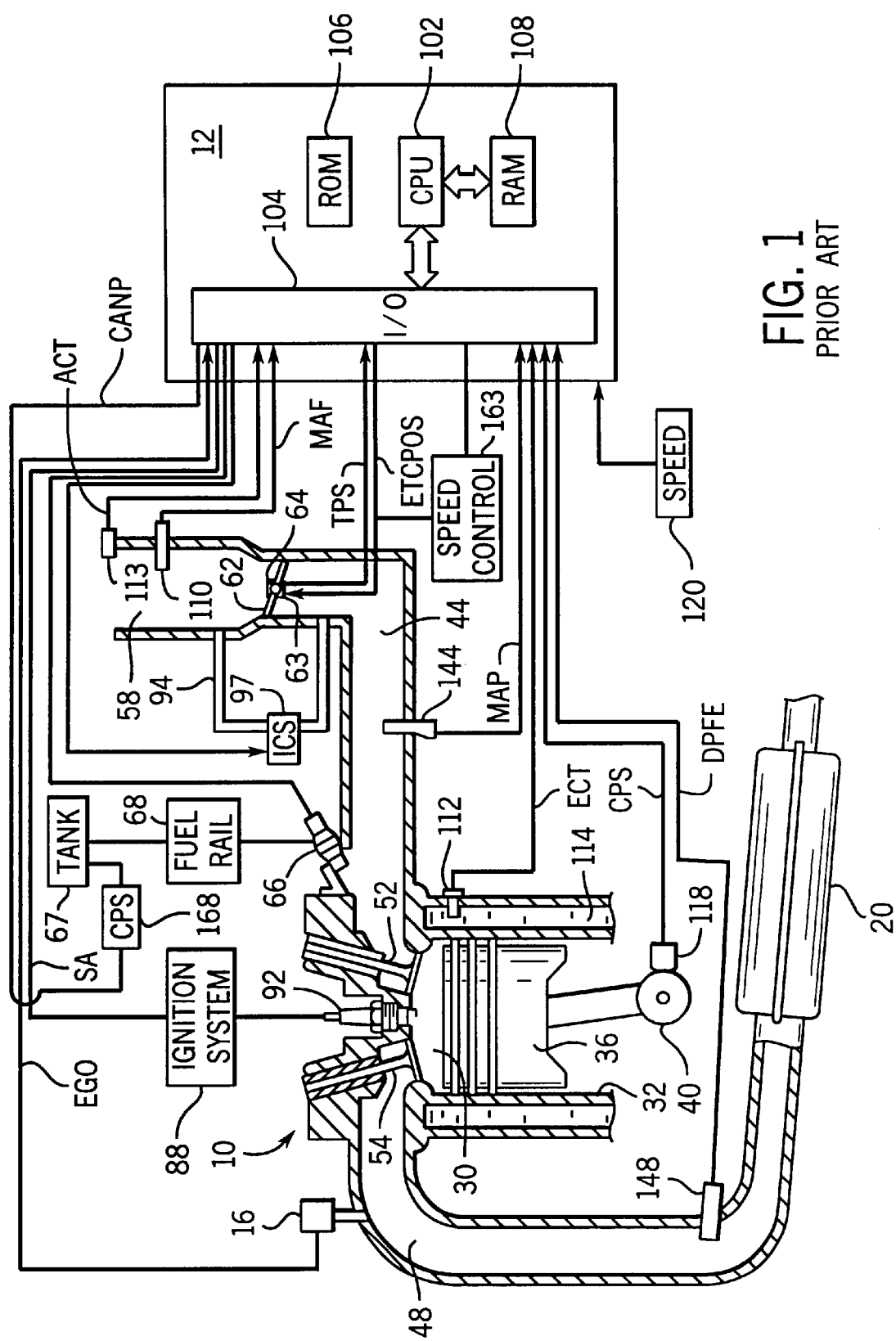
FIG. 1 is a schematic representation of a conventional internal combustion engine.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

Like reference numerals will be used to refer to like or similar parts from Figure to Figure in the following description of the drawings.

DETAILED DESCRIPTION OF THE INVENTION

A throttle body in accordance with the present invention may be used with a conventional internal combustion engine 10 as shown schematically in FIG. 1. The engine 10 comprises a plurality of cylinders, one cylinder of which is shown in FIG. 1. The engine 10 is controlled by main engine control electronics 12, which may include any of a number of engine controllers known to those skilled in the engine art. The engine 10 includes combustion chamber 30 and cylinder walls 32 with piston 36 positioned therein and connected to a crankshaft 40. The combustion chamber 30 is shown communicating with an intake manifold 44 and an exhaust manifold 48 via respective intake valve 52 and exhaust valve 54. The intake manifold 44 is shown communicating with throttle body 58 via throttle plate 62.

Primary air control is governed by the throttle plate 62. The throttle plate 62 is controlled by a throttle controller 63 which may be a mechanical system including vacuum solenoids or an electronic throttle controller known to those skilled in the art. The throttle position of the throttle plate 62 is measured by a throttle position sensor 64 which outputs a throttle position signal TPS. The engine control electronics 12 provide a signal ETCPOS to the throttle controller 63 so that airflow is inducted into engine 10 around throttle plate 62. When a vehicle is equipped with cruise control, the throttle position of the throttle plate 62 may also be controlled by an electronic throttle control 163 which receives signals from the engine control electronics 12. A speed sensor 120 provides speed signals to the engine control electronics 12 to facilitate operation of the electronic throttle control 163. The electronic throttle control 163 may a motor driven actuator that moves the throttle plate 62 electronically, and would be known to those skilled in the art. A throttle plate bypass passageway 94 provides a fluid communication path between a position upstream of the throttle plate 62 and a position downstream of the throttle plate 62. Air flow through the throttle plate bypass passageway 94 is controlled by a idle air control solenoid 97. The engine control electronics 12 provide the necessary signals to control the idle air control solenoid 97.

Fuel is delivered to a fuel injector 66 by a conventional fuel system including fuel tank 67, fuel pump (not shown), and fuel rail 68. A canister purge system including a canister purge solenoid 168 for periodically purging fuel vapors from the fuel tank 67 to the intake manifold 44 is controlled by a canister purge signal CANP from the engine control electronics 12. A conventional ignition system 88 provides ignition spark to combustion chamber 30 via spark plug 92 in response to spark advance signal SA from the engine control electronics 12. A catalytic type exhaust gas oxygen sensor 16 is shown coupled to exhaust manifold 48 upstream of a catalytic converter 20. The exhaust gas oxygen sensor 16 provides a signal EGO to the engine control electronics 12 which convert signal EGO into a two-state signal. A high voltage state of converted signal EGO indicates exhaust gases are rich of a desired air/fuel ratio and a low voltage state of converted signal EGO indicates exhaust gases are lean of the desired air/fuel ratio. Typically, the desired air/fuel ratio is selected as stoichiometry which falls within the peak efficiency window of the catalytic converter 20. A differential pressure (exhaust to intake) sensor 148 is shown coupled to exhaust manifold 48 upstream of a catalytic converter 20. The differential pressure sensor 148 provide a pressure feedback signal DPFE to the engine control electronics 12.

The engine control electronics 12 shown in FIG. 1 include a conventional microcomputer having: a microprocessor unit 102, input/output ports 104, read only memory 106, random access memory 108, and a conventional data bus. The engine control electronics 12 are shown receiving various signals from sensors mounted to the engine 10, in addition to those signals previously discussed, including measurements of: inducted mass air flow MAF from mass air flow sensor 110 coupled to throttle body 58; intake manifold absolute pressure MAP from intake manifold absolute pressure sensor 144 coupled to the intake manifold 44; engine coolant temperature ECT from engine coolant temperature sensor 112 coupled to cooling sleeve 114; intake air temperature ACT from intake air temperature sensor 113 coupled to throttle body 58; and a crankshaft position signal CPS from crankshaft position sensor 118 coupled to crankshaft 40.

It can be seen from FIG. 1 that the engine control electronics 12 communicate with a large number of engine mounted control devices including actuators (e.g., idle air control solenoid 97, canister purge solenoid 168, and any vacuum solenoids); sensors (e.g., mass air flow sensor 110, engine coolant temperature sensor 112, intake air temperature sensor 113, crankshaft position sensor 118, throttle position sensor 64, exhaust gas oxygen sensor 16, intake manifold absolute pressure sensor 144, and differential pressure (exhaust to intake) sensor 148); and other control modules (e.g., electronic throttle control 163 and throttle controller 63). Accordingly, as used herein, "engine control device" refers to operating condition sensors, actuators, and control modules other than the main engine controller.

As detailed above, one disadvantage of the type of vehicle electrical system shown in FIG. 1 is that a lengthy and complex wiring harness is necessary to connect the engine control electronics 12 (which are typically located against or within the firewall) and the engine mounted control devices including the actuators, the sensors, and the other control modules. The present invention provides one solution to this vehicle electrical system problem by providing a throttle body that includes additional electromechanical functions such as integration of the wiring harness, engine controls, sensors, actuators, and mechanical attachments. The integration of the throttle body with the other functions enables reduction of wiring and connectors and thereby provides for superior electrical performance and improved testability of the engine control subsystem.

Figure 2:
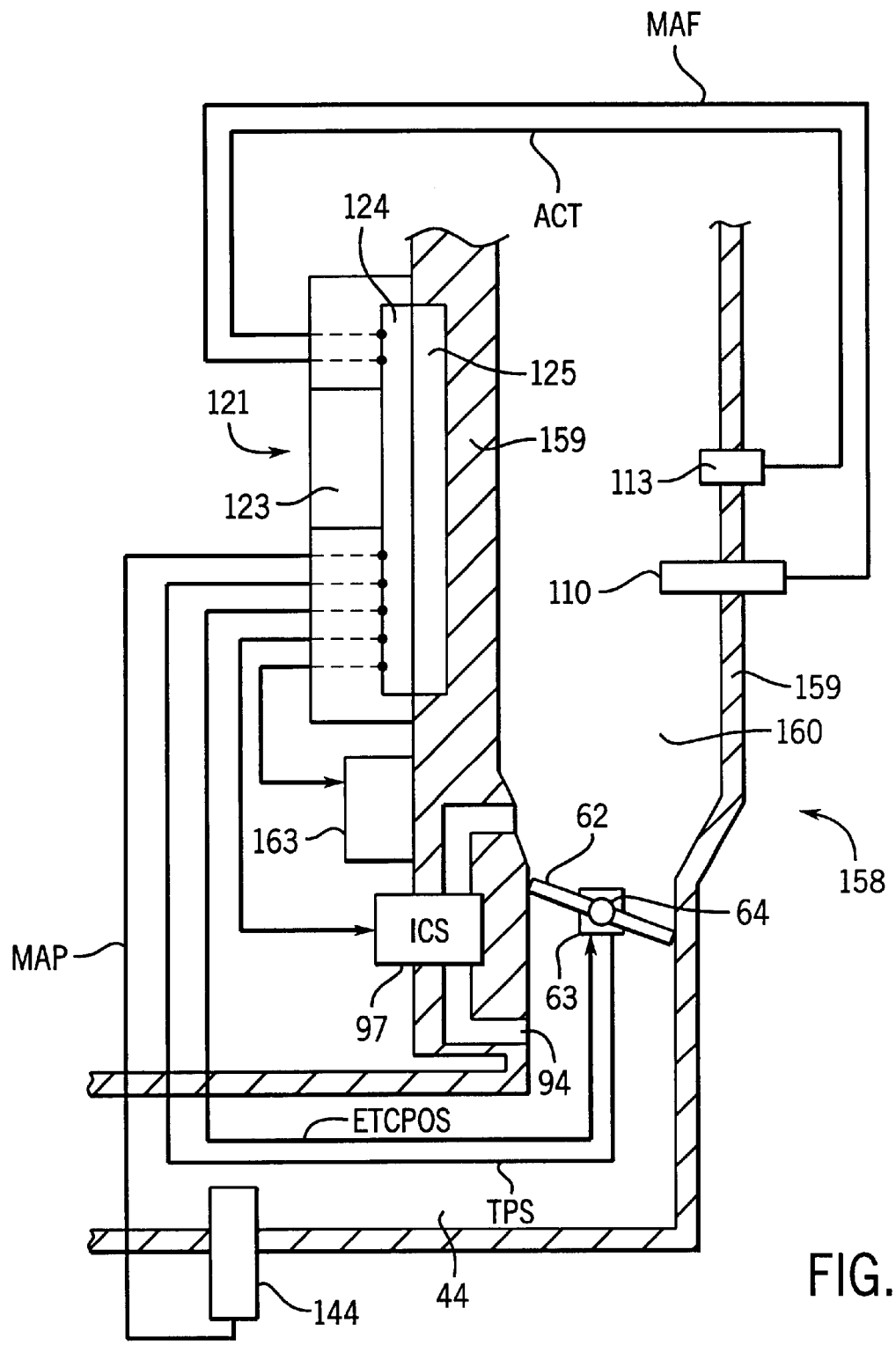
FIG. 2 is a schematic representation of a throttle body with integrated electronics according to an embodiment of the present invention.

Turning to FIG. 2, there is generally indicated at 158 a throttle body with integrated electronics in accordance with the present invention. The throttle body 158 includes a throttle body wall 159 (which may comprise a metallic or polymeric material) that defines an airflow passage 160. The airflow passage 160 of the throttle body 158 is in fluid communication with the intake manifold 44 via the throttle plate 62. The throttle plate 62 is controlled by the throttle controller 63 which may be a mechanical system including vacuum solenoids or an electronic throttle controller known to those skilled in the art. The throttle position of the throttle plate 62 is measured by the throttle position sensor 64 which outputs a throttle position signal TPS.

Engine control electronics 121 are mounted to the throttle body wall 159. The engine control electronics 121 communicate with a large number of engine mounted control devices including actuators (e.g., idle air control solenoid 97 in FIG. 2); sensors (e.g., mass air flow sensor 110, intake air temperature sensor 113, throttle position sensor 64, and intake manifold absolute pressure sensor 144 in FIG. 2); and other control modules (e.g., electronic throttle control 163 and throttle controller 63 in FIG. 2). While FIG. 2 shows the engine control electronics 121 communicating with certain actuators, sensors, and control modules, it should be understood that the engine control electronics 121 can communicate with any number of engine mounted control devices, including without limitation those shown in FIG. 1.

The engine control electronics 121 include an engine controller 123 and a wiring board 124 which is in electrical communication with the controller 123. The engine controller 123 may be selected from any of a number of engine controllers known to those skilled in the engine art. The wiring board 124 may be any of a number of circuit carrying structures, including without limitation rigid circuit boards, flexible circuit boards, combination rigid/flexible circuit boards, and etched tri-layered metal. In the throttle body 158 of FIG. 2, the engine mounted control devices (which may include actuators, sensors, and control modules) are interconnected using the wiring board 124. The engine mounted control devices can be interconnected to the wiring board 124 using a metallurgical interface (e.g., soldering, wire bonding, welding, or the like), mechanical interfaces (e.g., press fit, conductor to conductor), or polymeric interfaces (e.g., adhesives with conductive fillers, z-axis adhesives, z-axis interposers). If a heat sink is required for the engine control electronics 121, the heat sink may comprise the throttle body itself or a discrete heat sink 125 (formed from known heat sink materials) which is in molded with the throttle body wall 159.

Figure 3:
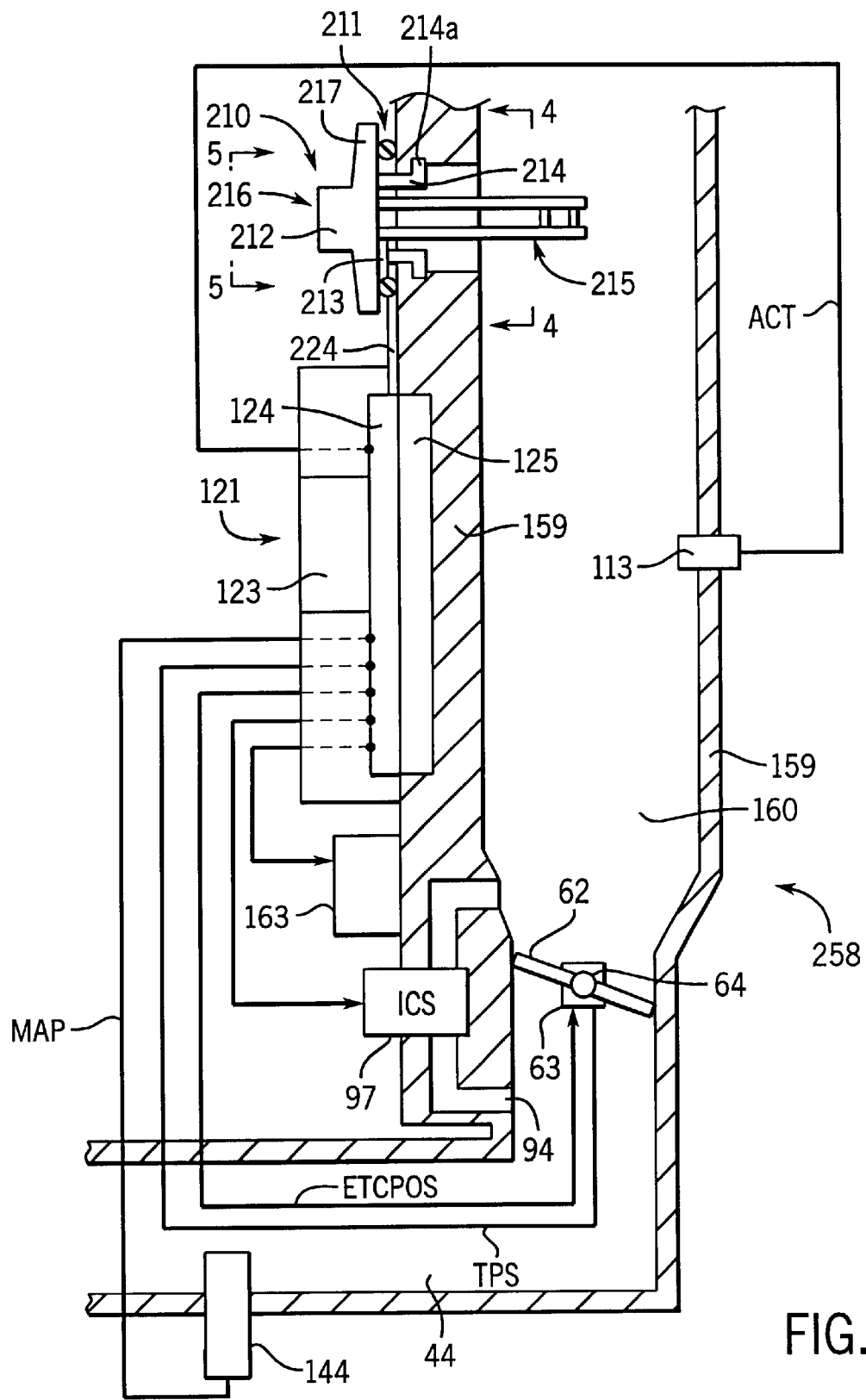
FIG. 3 is a schematic representation of another embodiment of a throttle body with integrated electronics according to the present invention.

Referring now to FIG. 3, there is generally indicated at 258 another embodiment of a throttle body with integrated electronics in accordance with the present invention. The throttle body 258 includes a throttle body wall 159 (which may comprise a metallic or polymeric material) that defines an airflow passage 160. The airflow passage 160 of the throttle body 258 is in fluid communication with the intake manifold 44 via the throttle plate 62. The throttle plate 62 is controlled by the throttle controller 63 which may be a mechanical system including vacuum solenoids or an electronic throttle controller known to those skilled in the art. The throttle position of the throttle plate 62 is measured by the throttle position sensor 64 which outputs a throttle position signal TPS.

Engine control electronics 121 are mounted to the throttle body wall 159. The engine control electronics 121 communicate with a large number of engine mounted control devices including actuators (e.g., idle air control solenoid 97 in FIG. 3); sensors (e.g., intake air temperature sensor 113, throttle position sensor 64, and intake manifold absolute pressure sensor 144 in FIG. 3); and other control modules (e.g., electronic throttle control 163 and throttle controller 63 in FIG. 3). While FIG. 3 shows the engine control electronics 121 communicating with certain actuators, sensors, and control modules, it should be understood that the engine control electronics 121 can communicate with any number of engine mounted control devices, including without limitation those shown in FIG. 1. The engine control electronics 121 include an engine controller 123 and a wiring board 124 which is in electrical communication with the controller 123. The engine controller 123 may be selected from any of a number of engine controllers known to those skilled in the engine art. In the throttle body 258 of FIG. 3, the engine mounted control devices (which may include actuators, sensors, and control modules) are interconnected using the wiring board 124.

Figure 4:
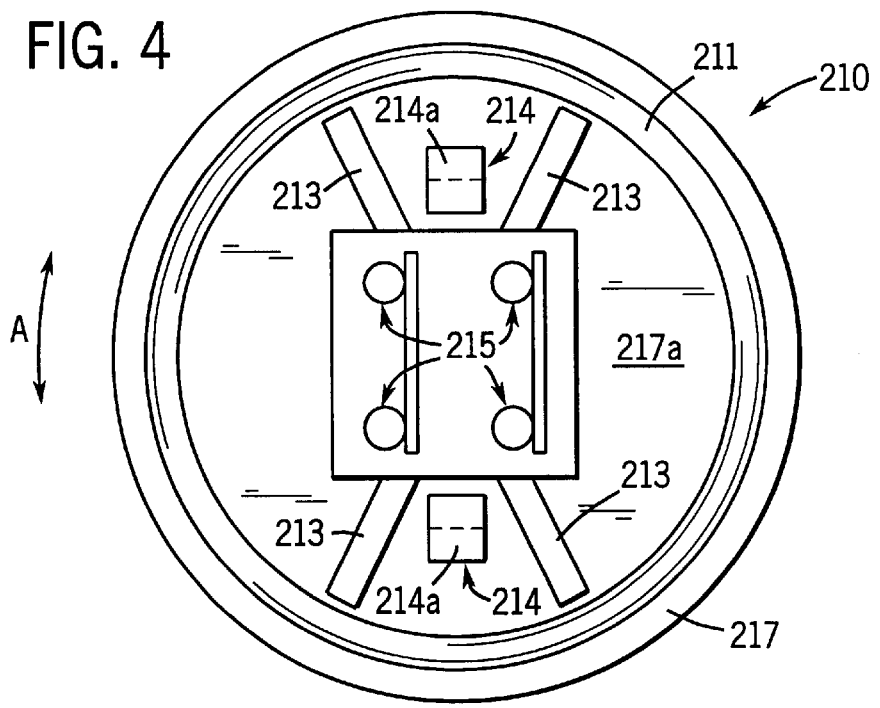
FIG. 4 is a bottom view of a sensor shown in FIG. 3 taken along line 4—4 with the throttle body wall removed for clarity.

Still referring to FIG. 3, there is shown a mass air flow sensor 210 that is mounted in the throttle body wall 159 of the throttle body 258. The mass air flow sensor 210 includes a twist lock feature that is used to create a mechanical connection with the throttle body wall 159 of the throttle body 258 and to create an electrical connection with the wiring board 124. The components of the mass air flow sensor 210 are shown in FIGS. 3 and 4. The mass air flow sensor 210 has a mounting head 216 that includes a raised portion 212 and a circumferential flange 217 that extends outward from the lower end of the raised portion 212. The underside 217*a* of the mounting head 216 has downwardly extending fingers 214 that terminate in outwardly and laterally extending tabs 214*a*. Typically, the mounting head is formed from plastic. Air flow sensor elements 215 are affixed to the underside 217*a* of the mounting head 216 and are electrically connected with sensor leads 213. The sensor leads 213 may be in molded or plated leads. Of course, a different number of sensor leads and sensor elements may be used in the mass air flow sensor 210. A flexible O-ring 211 is also attached to the underside 217*a* of the mounting head 216 and may be formed from elastomeric materials known in the art.

Figure 5:
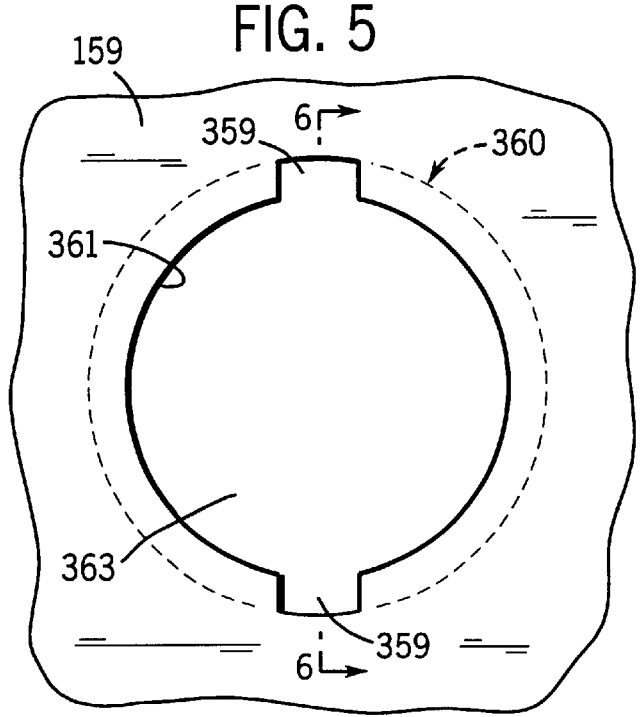
FIG. 5 is a side view of a portion the throttle body in FIG. 3 taken along line 5—5 with the sensor removed for clarity.
Figure 6:
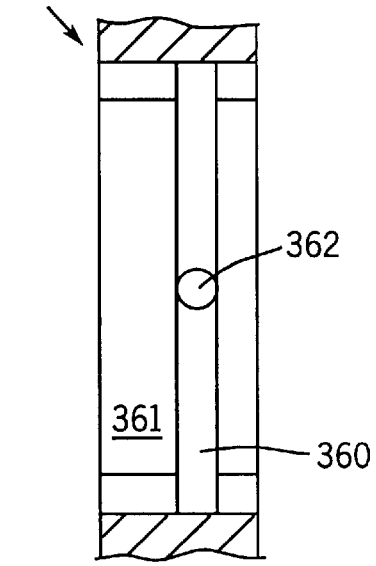
FIG. 6 is a cross-sectional view of the throttle body of FIG. 5 taken along line 6—6.

Referring now to FIGS. 4, 5 and 6, the means for mechanical installing the mass air flow sensor 210 on the throttle body wall 159 of the throttle body 258 are shown. First, looking at FIGS. 5 and 6, it can be seen that the section of the throttle body wall 159 where the mass air flow sensor 210 is installed has a substantially circular bore 363 which has diametrically opposed recessed areas 359. Below the surface of the throttle body wall 159, there is a groove 360 in the inner surface 361 of the circular bore 363. During installation of the mass air flow sensor 210, the downwardly extending fingers 214 of the mounting head 216 are aligned with the diametrically opposed recessed areas 359 of the circular bore 363 and the mass air flow sensor 210 is moved toward the throttle body wall 159. When the O-ring 211 of the mass air flow sensor 210 contacts the throttle body wall 159, the mass flow sensor is rotated in either of directions "A" shown in FIG. 4. As a result, the laterally extending tabs 214*a* of the downwardly extending fingers 214 engage the inner surface of the groove 360 in the throttle body wall 159. The mass air flow sensor 210 may then be rotated until the downwardly extending fingers 214 contact stop 362 in the groove 360 in the throttle body wall 159. By proper configuration of the downwardly extending fingers 214, the O-ring 211 and the groove 360, the mass air flow sensor 210 is both secured and sealed to the throttle body wall 159 by a simple twisting motion during installation. The twist lock feature provides the mechanical force to hold the sensor in place and seal the sensor.

Referring now to FIG. 3, it can be seen that the twisting motion used to install the mass air flow sensor 210 on the throttle body wall 159 also serves to establish an electrical connection between the mass air flow sensor 210 and the wiring board 124. In FIG. 3, it can be seen that the wiring board 124 includes an electrical connector 224 that extends outwardly from the wiring board 124 and is electrically connected to the wiring board 124. After installation of the mass air flow sensor 210 on the throttle body wall 159 as described above, at least one of the sensor leads 213 on the underside 217*a* of the mounting head 216 is placed in contact with the electrical connecter 224 of the wiring board 124. In other words, the twist lock feature provides the mechanical force for contacting the electrical circuit, and the mass air flow sensor 210 is placed in electrical communication with the wiring board 124 and the engine controller 123.

While the twist lock feature that is used to create a mechanical and an electrical connection between the mass air flow sensor 210 and the wiring board 124 has been described with reference to a mass air flow sensor, it should be understood that the mechanical electrical connection system is not limited to mass air flow sensors but may be applied to any sensor, actuator, control module or other component that must be placed in electrical communication with throttle body mounted engine control electronics. Furthermore, other equivalent means for accomplishing the twist lock installation are possible. For instance, an alternative sensor is shown in FIG. 4A. The sensor 310 in FIG. 4A may be mounted in the throttle body wall 159 of the throttle body 258. The mass air flow sensor 310 includes a twist lock feature that is used to create a mechanical connection with the throttle body wall 159 of the throttle body 258 and to create an electrical connection with the wiring board 124. The mass air flow sensor 310 has a mounting head 316 that includes a raised portion 312 and a circumferential flange 317 that extends outward from the lower end of the raised portion 312. Typically, the mounting head is formed from plastic. Air flow sensor elements 315 are affixed to the underside 317a of the mounting head 216 by way of a protruding disk shaped section 320. The sensor elements 315 are electrically connected with four sensor leads 313. The sensor leads 313 may be in molded or plated leads. Of course, a different number of sensor leads and sensor elements may be used in the mass air flow sensor 310. A flexible O-ring 311 is also attached to the underside 317a of the mounting head 316 and surrounds the protruding disk shaped section 320. The O-ring 311 may be formed from elastomeric materials known in the art. Ramp-shaped blades 314 extend laterally from opposite diametrically opposed sides of the protruding disk shaped section 320 of the mass air flow sensor 310.

The means for mechanical installing the mass air flow sensor 310 on the throttle body wall 159 of the throttle body 258 is similar to that described above for the mass airflow sensor 210. During installation of the mass airflow sensor 310 of FIG. 4A, the ramp-shaped blades 314 of the mounting head 316 are aligned with the diametrically opposed recessed areas 359 of the circular bore 363 (shown in FIG. 5) and the mass air flow sensor 310 is moved toward the throttle body wall 159. When the O-ring 311 of the mass air flow sensor 310 contacts the throttle body wall 159, the mass flow sensor is rotated in either of directions "B" shown in FIG. 4A. As a result, the ramp-shaped blades 314 engage the inner surface of the groove 360 in the throttle body wall 159. The mass air flow sensor 310 may then be rotated until the ramp-shaped blades 314 contact stop 362 in the groove 360 in the throttle body wall 159. By proper configuration of the ramp-shaped blades 314, the O-ring 311 and the groove 360, the mass air flow sensor 310 is both secured and sealed to the throttle body wall 159 by a simple twisting motion during installation. The twist lock feature provides the mechanical force to hold the sensor in place and seal the sensor.

Referring now to FIG. 3, it can be seen that the twisting motion used to install the mass air flow sensor 310 on the throttle body wall 159 also serves to establish an electrical connection between the mass air flow sensor 310 and the electrical connector 224 of the wiring board 124. After installation of the mass air flow sensor 310 on the throttle body wall 159 as described above, at least one of the sensor leads 313 on the underside 317a of the mounting head 316 is placed in contact with the electrical connecter 224 of the wiring board 124. In other words, the twist lock feature provides the mechanical force for contacting the electrical circuit, and the mass air flow sensor 310 is placed in electrical communication with the wiring board 124 and the engine controller 123. It should be understood that other equivalent means for accomplishing the twist lock feature will become apparent to those skilled in the art when reading this description, and therefore, are within the scope of the invention. For example, the twist lock feature may be accomplished with quarter-turn threads on the mounting head 216 of the mass air flow sensor 210 that engage threads with a stop on the throttle body 159.

Figure 7:
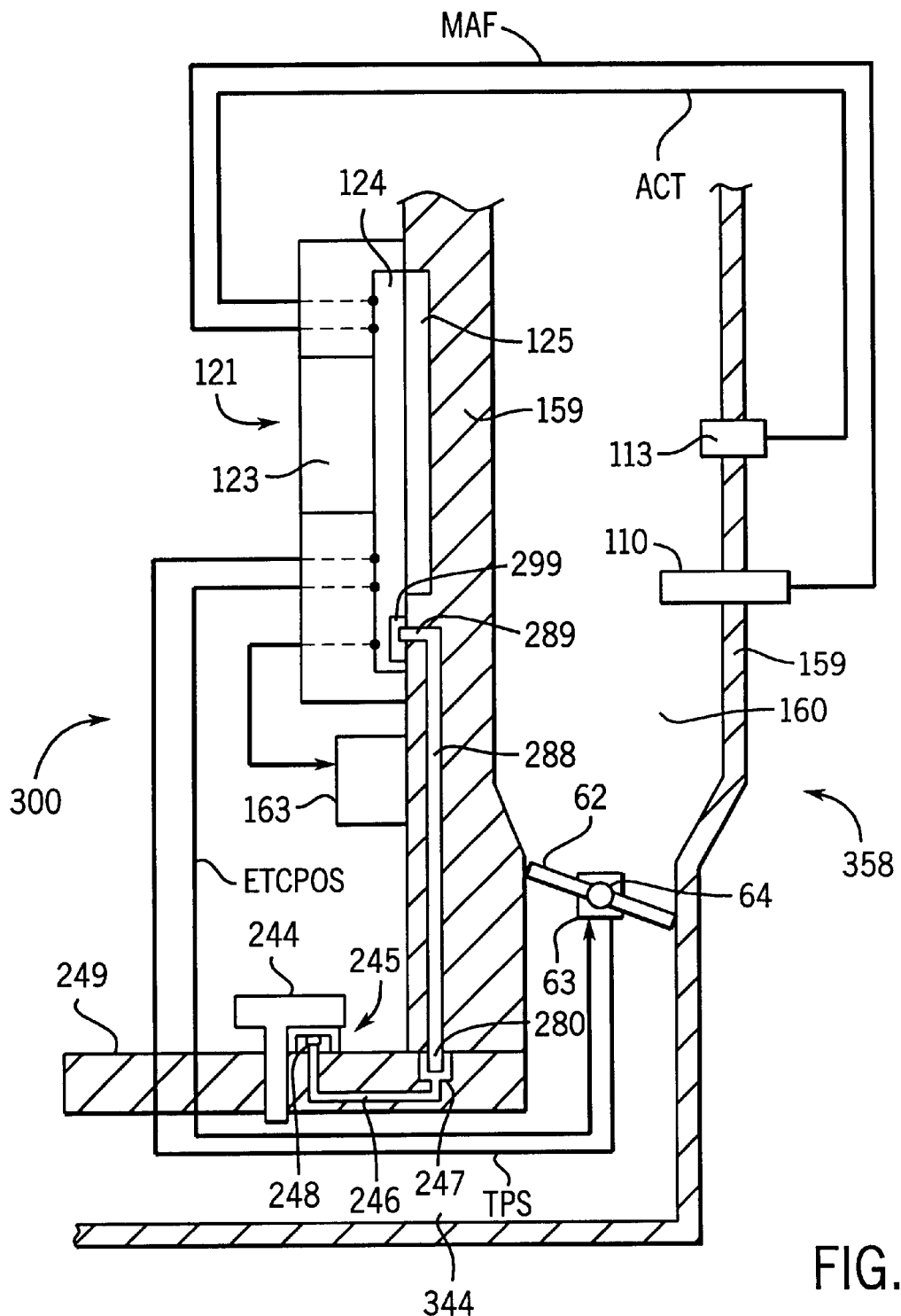
FIG. 7 is a schematic representation of an embodiment of an internal combustion engine air control system with integrated electronics according to the present invention.

Referring now to FIG. 7, there is shown an air control system 300 for an internal combustion engine that includes an air intake manifold 344 and a throttle body 358 with integrated electronics in accordance with the present invention. The throttle body 358 includes a throttle body wall 159 (which may comprise a metallic or polymeric material) that defines an airflow passage 160. The airflow passage 160 of the throttle body 358 is in fluid communication with the intake manifold 344 via the throttle plate 62. The throttle plate 62 is controlled by the throttle controller 63 which may be a mechanical system including vacuum solenoids or an electronic throttle controller known to those skilled in the art. The throttle position of the throttle plate 62 is measured by the throttle position sensor 64 which outputs a throttle position signal TPS.

Engine control electronics 121 are mounted to the throttle body wall 159. The engine control electronics 121 communicate with a large number of engine mounted control devices including actuators; sensors (e.g., mass air flow sensor 110, intake air temperature sensor 113, and throttle position sensor 64 in FIG. 7); and other control modules (e.g., electronic throttle control 163 and throttle controller 63 in FIG. 7). While FIG. 7 shows the engine control electronics 121 communicating with certain actuators, sensors, and control modules, it should be understood that the engine control electronics 121 can communicate with any number of engine mounted control devices, including without limitation those shown in FIG. 1. The engine control electronics 121 include an engine controller 123 and a wiring board 124 which is in electrical communication with the controller 123. The engine controller 123 may be selected from any of a number of engine controllers known to those skilled in the engine art. In the throttle body 358 of FIG. 7, the engine mounted control devices (which may include actuators, sensors, and control modules) are interconnected using the wiring board 124.

Still referring to FIG. 7, it can be seen that the intake manifold 344 includes an in molded lead frame 246 that includes a first terminal end 248 and a second terminal end 247. There is also shown an intake manifold absolute pressure sensor 244 that is mounted in a wall 249 of the intake manifold 344. The intake manifold absolute pressure sensor 244 includes an in molded electrical connector 245 affixed to the underside of the intake manifold absolute pressure sensor 244. The throttle body wall 159 of the throttle body 358 also includes an in molded lead frame 288 that includes a first terminal end 280 and a second terminal end 289. The lead frame 246 and the lead frame 288 may be formed from any conductive material. It can be seen that when the throttle body 358 and the air intake manifold 344 are mechanically attached, the first terminal end 280 of the lead frame 288 and the second terminal end 247 of the lead frame 246 are placed in contact thereby forming an electrical connection that extends from the first terminal end 248 of the lead frame 246 to the second terminal end 289 of the lead frame 288.

Further, when the intake manifold absolute pressure sensor 244 is installed in the wall 249 of the intake manifold 344, the in molded electrical connector 245 affixed to the underside of the intake manifold absolute pressure sensor 244 is placed in contact with the first terminal end 247 of the lead frame 246 thereby forming an electrical connection between the intake manifold absolute pressure sensor 244 and the lead frames 246 and 288. In addition, when the wiring board 124 is installed on the throttle body wall 159, an electrical connector 299 affixed to the wiring board 124 is placed in contact with the second terminal end 289 of the lead frame 288 thereby forming an electrical connection between the wiring board 124 and the lead frames 246 and 288. Thus, an electrical connection is formed between the intake manifold absolute pressure sensor 244 and the engine control electronics 121 by way of the in molded lead frames 246 and 288. In another embodiment, the lead frames 246 and 288 may be integrally attached to the throttle body wall 159 and the wall 249 of the intake manifold 344 by plating the lead frames 246 and 288 on an outer surface of the throttle body wall 159 and an outer surface of the wall 249 of the intake manifold 344.

Although the present invention has been described in considerable detail with reference to certain embodiments, one skilled in the art will appreciate that the present invention can be practiced by other than the described embodiments, which have been presented for purposes of illustration and not of limitation. Therefore, the scope of the appended claims should not be limited to the description of the embodiments contained herein.

What is claimed is:

1. A throttle body for use in an internal combustion engine, the throttle body comprising:

a throttle body wall defining an airflow passage in the throttle body;

a movable throttle plate in the airflow passage, the throttle plate substantially conforming to the interior dimensions of the air flow passage;

an engine control device attached to the throttle body wall; and engine control electronics mounted to the throttle body wall in spaced apart relationship with the engine control device, wherein the engine control electronics includes an engine controller and a wiring board, the engine controller being electrically connected to the wiring board, and the wiring board being electrically connected with the engine control device, wherein the wiring board is electrically connected with the engine control device by a mechanical interface, wherein the engine control device is a sensor or an actuator, and wherein the engine control device is attached to the throttle body wall by twisting the engine control device in a bore in the throttle body wall such that cooperating locking elements on the engine control device and an inner surface of the bore in the throttle body wall engage.

2. The throttle body of claim 1 further comprising:

a heat sink attached to the throttle body wall, the heat sink being positioned in contact with the engine control electronics.

3. The throttle body of claim 1 wherein:

the engine control device is a sensor including a sensor element attached to a mounting head, the sensor element being electrically connected to an electrically conductive lead affixed to the mounting head; and the wiring board includes an electrical connector extending outward from the wiring board, the electrical connector contacting the electrically conductive lead to form an electrical connection.

4. The throttle body of claim 3 wherein:

the electrically conductive lead is affixed to an underside of the mounting head of the sensor, and the electrically conductive lead engages an outer surface of the electrical connector of the wiring board.

5. A throttle body for use in an internal combustion engine, the throttle body comprising:

a throttle body wall having an inner surface and an outer surface, the inner surface defining an airflow passage in the throttle body;

a movable throttle plate in the airflow passage, the throttle plate substantially conforming to the interior dimensions of the air flow passage;

an engine control device attached to the outer surface of the throttle body wall; and engine control electronics mounted to the outer surface of the throttle body wall in spaced apart relationship with the engine control device, wherein the engine control electronics includes an engine controller and a wiring board, the engine controller being electrically connected to the wiring board, and the wiring board being electrically connected with the engine control device by a mechanical interface, wherein the engine control device is a sensor including a sensor element attached to a mounting head, the sensor element being electrically connected to an electrically conductive lead affixed to the mounting head; and wherein the wiring board includes an electrical connector extending outward from the wiring board, the electrical connector contacting the electrically conductive lead to form an electrical connection.

6. The throttle body of claim 5 further comprising:

a heat sink attached to the throttle body wall, the heat sink being positioned in contact with the engine control electronics.

7. The throttle body of claim 5 wherein:

the engine control device is attached to the throttle body wall by twisting the engine control device in a bore in the throttle body wall such that cooperating locking elements on the engine control device and an inner surface of the bore in the throttle body wall engage.

8. The throttle body of claim 5 wherein:

the electrically conductive lead is affixed to an underside of the mounting head of the sensor, and the electrically conductive lead engages an outer surface of the electrical connector of the wiring board.

* * * * *